United States Patent
Chen et al.

(10) Patent No.: US 7,498,642 B2
(45) Date of Patent: Mar. 3, 2009

(54) PROFILE CONFINEMENT TO IMPROVE TRANSISTOR PERFORMANCE

(75) Inventors: Chien-Hao Chen, Chuangwei Township (TW); Chun-Feng Nieh, Baoshan Township (TW); Karen Mai, Jhonghe (TW); Tze-Liang Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 231 days.

(21) Appl. No.: 11/114,567

(22) Filed: Apr. 25, 2005

(65) Prior Publication Data

US 2006/0244080 A1    Nov. 2, 2006

(51) Int. Cl.
    *H01L 29/76*    (2006.01)
(52) U.S. Cl. ...................... 257/408; 257/345
(58) Field of Classification Search ................. 257/408, 257/404, 344, 345
    See application file for complete search history.

(56) References Cited

U.S. PATENT DOCUMENTS

| | | | |
|---|---|---|---|
| 4,755,865 A * | 7/1988 | Wilson et al. ................ 257/754 |
| 5,108,935 A | 4/1992 | Rodder | |
| 5,262,664 A * | 11/1993 | Jung-Suk .................... 257/344 |
| 5,576,226 A | 11/1996 | Hwang | |
| 5,585,286 A | 12/1996 | Aronowitz et al. | |
| 5,719,425 A | 2/1998 | Akram et al. | |
| 5,885,861 A | 3/1999 | Gardner et al. | |
| 5,933,721 A | 8/1999 | Hause et al. | |
| 5,959,333 A | 9/1999 | Gardner et al. | |
| 6,225,151 B1 | 5/2001 | Gardner et al. | |
| 6,268,640 B1 * | 7/2001 | Park et al. .................... 257/607 |
| 6,271,095 B1 | 8/2001 | Yu | |
| 6,458,641 B2 | 10/2002 | Tsukamoto | |
| 6,475,885 B1 * | 11/2002 | Sultan ........................ 438/514 |
| 6,555,439 B1 | 4/2003 | Xiang et al. | |
| 6,680,250 B1 | 1/2004 | Paton et al. | |
| 2004/0031970 A1 | 2/2004 | Chakravarthi et al. | |
| 2004/0102013 A1 | 5/2004 | Hwang et al. | |
| 2004/0173855 A1 | 9/2004 | Masuoka et al. | |
| 2005/0110082 A1 | 5/2005 | Cheng et al. | |
| 2006/0051922 A1 | 3/2006 | Huang et al. | |
| 2006/0216900 A1 | 9/2006 | Wang et al. | |
| 2006/0234455 A1 | 10/2006 | Chen et al. | |

* cited by examiner

*Primary Examiner*—Mark Prenty
(74) *Attorney, Agent, or Firm*—Slater & Matsil, L.L.P.

(57) ABSTRACT

A semiconductor device having well-defined profiles is disclosed. A p-type pocket/halo region is preferably formed along a channel-side border of the heavily doped source/drain region to neutralize diffused n-type elements. A diffusion-retarding region is formed to retard diffusion for both p-type and n-type impurities by substantially overlapping or extending beyond the p-type pocket/halo region and the N+ S/D region at least on the channel side.

15 Claims, 6 Drawing Sheets

PROFILE CONFINEMENT TO IMPROVE TRANSISTOR PERFORMANCE

CROSS-REFERENCE TO RELATED APPLICATIONS

This application relates to the following co-pending and commonly assigned patent application: U.S. Pat. application Ser. No. 11/086,498, filed Mar. 22, 2005. entitled "Smart Grading Implant with Diffusion Retarding Implant for Making Integrated Circuit Chips."

TECHNICAL FIELD

This invention relates generally to transistor manufacturing processes, and more specifically to profile confinement of source/drain regions and gates.

BACKGROUND

As the dimensions of transistors are scaled down, the reduction of vertical junction depth and suppression of dopant lateral diffusion in order to control short-channel characteristics become greater challenges. The implant of p-type dopants (impurities), such as boron, $BF_2$, and indium is typically needed to neutralize lateral diffusion of n-type impurities (arsenic, phosphorus, etc.) from source/drain regions, and to keep the short channel effect under control.

However, it is difficult to confine the boron/$BF_2$ within desired locations to effectively neutralize the lateral diffusion of the n-type dopants. Having high diffusibility, boron and $BF_2$ dopants diffuse away easily from original implanted regions during subsequent processes that require elevated temperatures, such as rapid thermal annealing (RTA) steps. Therefore, the p-type dopant's ability to neutralize the n-type dopants diffused from source/drain regions is reduced.

One of the commonly used methods to effectively confine the p-type pocket/halo profile is lowering the temperatures of the RTA. The activation of the source/drain impurities, however, is affected, resulting in degraded drive current.

Other methods are also explored to reduce the diffusion and confine the profile of the dopants. U.S. Pat. No. 5,885,861 discussed a method of confining the diffusion of p-type or n-type impurities. As shown in FIG. 1, a gate electrode 6 is formed over a substrate 2. N-type dopants and p-type dopants are introduced into the gate electrode 6 and lightly diffused source/drain (LDD) regions 8 of nMOS devices and pMOS devices, respectively. Arrows 10 symbolize the implanting. For n-type devices, nitrogen and fluorine are co-implanted to the gate electrode 6 and LDD regions 8, and for p-type devices, nitrogen and carbon are co-implanted to the gate electrode 6 and LDD regions 8. Nitrogen, carbon, and fluorine have the function of retarding the diffusion of respective dopants. Therefore, the diffusion of the dopants is controlled when annealed, and thus the LDD regions 8 have higher impurity concentrations and more confined profiles.

To achieve better results, n-type impurities also need to be confined. U.S. Pat. application Ser. No. 2004/0102013 discussed a method for confining the profile of phosphorus in deep source/drain regions 16 of nMOS devices, as illustrated in FIG. 2. After the formation of a gate electrode 12 over a substrate 20, LDD regions 14 are formed by introducing an n-type dopant such as arsenic. Spacers 11 are then formed. Arrows 22 symbolize the impurity implants. Phosphorus is introduced to form deep source/drain regions 16. Carbon or fluorine is also implanted into the same regions. The addition of carbon or fluorine makes relatively high concentrations of phosphorus possible since less is diffused away, and transistor drive current is improved without unduly compromising the short channel characteristics.

However, these approaches are effective only in suppressing vertical diffusion. As a result, the junction depth is effectively controlled by the implantation of carbon/fluorine/nitrogen. The same approaches are less effective in suppressing lateral diffusion of the dopants into the channel region. A method of suppressing lateral diffusion to improve the short channel characteristics of NMOS devices, therefore, is needed.

SUMMARY OF THE INVENTION

In accordance with one aspect of the present invention, a method of forming a semiconductor device (transistor) having a well-confined profile is provided. The method includes forming a lightly diffused source/drain (LDD) region and a heavily doped source/drain (N+ S/D) region. A p-type pocket/halo region is formed preferably along a channel-side border of the N+ S/D region, to neutralize diffused n-type elements from the N+ S/D region. A diffusion-retarding region is formed to retard diffusion of both p-type and n-type impurities. The diffusion-retarding region is preferably tilt implanted to extend under the gate electrode. More than one pocket/halo region can be formed through multiple implants so that a customized contour of p-type impurities can be formed. This in turn improves the profile of the N+ S/D region. The diffusion-retarding region is also preferably formed in the gate electrode. This reduces the diffusion of n-type impurities into the gate dielectric, and thus preserves gate oxide integrity.

In accordance with another aspect of the present invention, a transistor having a well-confined source/drain profile includes a semiconductor substrate having a channel region, a gate dielectric over the channel region, a gate electrode over the gate dielectric, a lightly doped source/drain region substantially aligned with an edge of the gate electrode, and a heavily doped source/drain (N+ S/D) region in the semiconductor substrate. The semiconductor device further includes one or more p-type pocket/halo regions substantially along a channel-side border of the N+ S/D region, and a diffusion-retarding region substantially overlapping or extending beyond the LDD region, N+ S/D region and pocket/halo region at least from a side close to the channel region (channel-side), and preferably also from the bottom side.

The diffusion-retarding region retards the diffusion of the n-type impurities of the source/drain regions, enabling high concentrations in the LDD and N+ S/D regions. The p-type impurity diffusion is also reduced, forming regions with higher concentration of p-type impurities. Higher concentration of p-type impurities in turn improves the neutralization ability, and thus further improves the profile of source/drain regions. Therefore, the gate oxide integrity, threshold voltage-control and drain saturation current of the resulting semiconductor devices are improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In order to manufacture an nMOS device with a well-confined profile, greater abruptness of n-type impurities, which means that the impurity regions have well-defined borders, in respective source/drain regions are preferred. The preferred embodiments of the present invention use p-type impurities to neutralize the n-type diffusion. Since p-type impurities also out-diffuse, the effectiveness of the neutralization is reduced. This problem is also addressed by the preferred embodiments of the present invention.

The cross sectional views of the intermediate stages in the manufacture of the preferred embodiment are illustrated in FIGS. 3 through 9, wherein like reference numbers are used to designate like elements throughout the various views and illustrative embodiments of the present invention.

Figure 1:
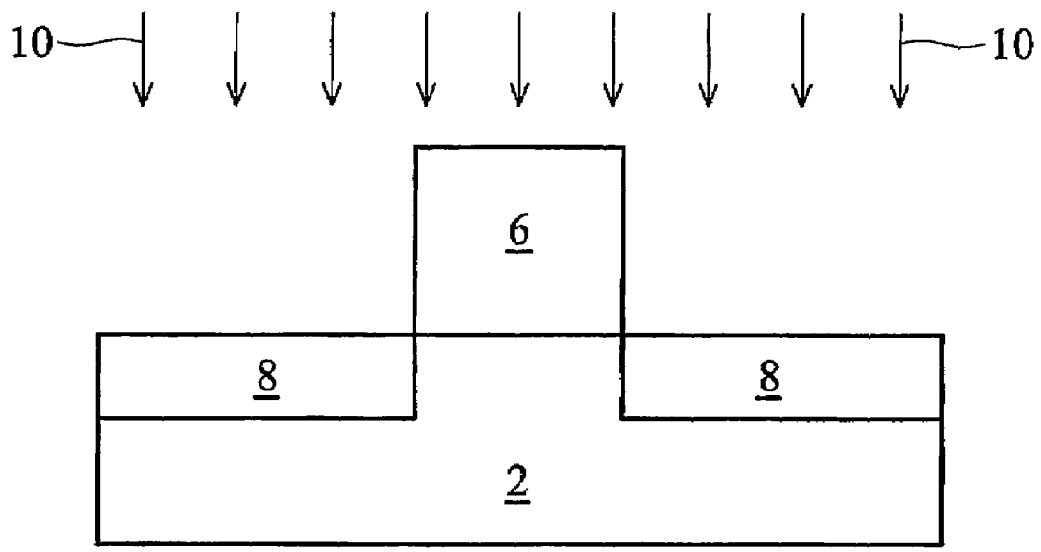
FIG. 1 illustrates a conventional method of making transistors, wherein nitrogen and fluorine are used to retard diffusion of n-type impurities, and nitrogen and carbon are used to retard diffusion of p-type impurities.
Figure 2:
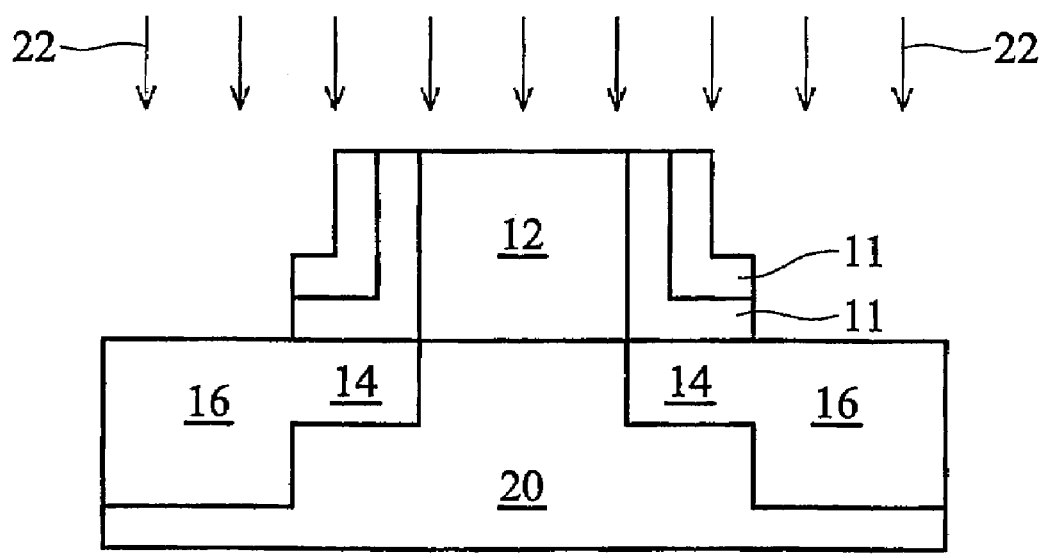
FIG. 2 illustrates a conventional method of making nMOS transistors by co-implanting carbon or fluorine with phosphorus.
Figure 3:
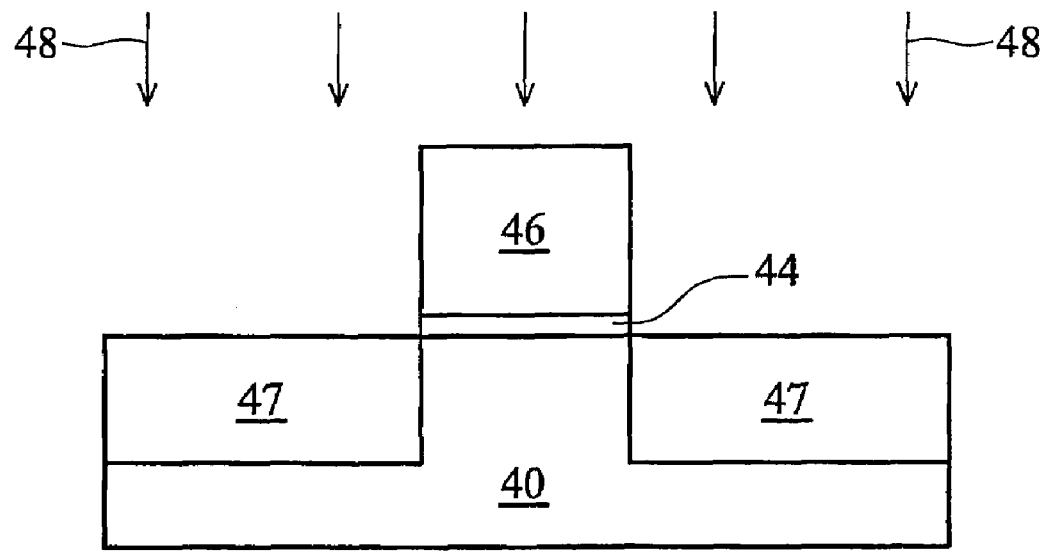
FIGS. 3 through 9 are cross-sectional views of intermediate stages in the manufacture of an nMOS transistor embodiment according to the principles of the present invention.

FIG. 3 illustrates a gate dielectric 44 and a gate electrode 46 formed on a substrate 40. As known in the art, a gate dielectric layer is formed on the substrate 40. The substrate 40 can be formed of common substrate materials such as silicon, SiGe, strained silicon on SiGe, silicon on insulator (SOI), silicon germanium on insulator (SGOI), germanium on insulator (GOI), and the like. The gate dielectric layer preferably has a high K value. A gate electrode layer, preferably comprising polysilicon, metals or metal silicides, is formed on the gate dielectric layer. The gate electrode layer and the gate dielectric layer are then patterned to form the gate electrode 46 and the gate dielectric 44, respectively.

An optional pre-amorphized implantation (PAI), as symbolized by arrows 48, is performed to reduce the dopant channeling effect and enhance dopant activation. In the preferred embodiment, silicon or germanium is implanted. In other embodiments, inert gases, such as neon, argon, krypton, xenon, and radon, are used. The pre-amorphized implantation prevents subsequently doped impurities from channeling through spaces between the crystal lattice structure and reaching depths greater than desired. At least a top portion of the (polysilicon) gate electrode 46 and exposed portions 47 of the (single crystalline) substrate 40 are turned into an amorphous state as a result of the PAI.

Figure 4:
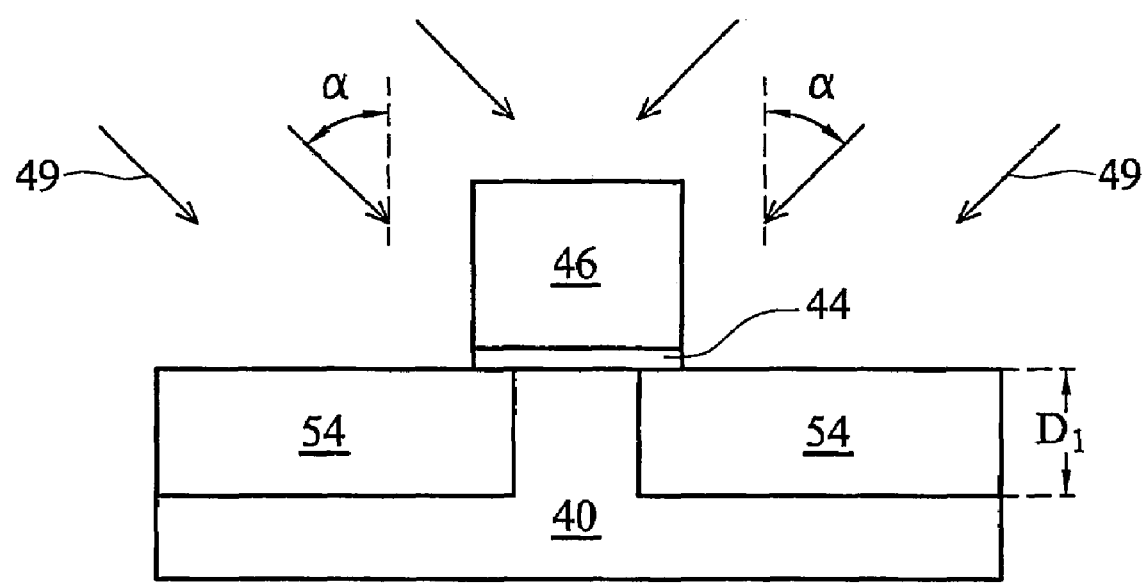

FIG. 4 illustrates the implanting of diffusion-retarding impurities, which preferably comprise carbon, fluorine, nitrogen, and combinations thereof. Preferably, the implant as symbolized by arrows 49, is tilted at an angle α ranges between about 0 degree to about 50 degrees. Two tilted implants are preferably performed, with one tilting toward the other, and thus forming diffusion-retarding regions 54. With tilt implantation, the diffusion-retarding regions 54 extend under the gate electrode 46, and thus a better effect is achieved. The preferred dose of the diffusion-retarding elements is between about $1E14/cm^2$ and about $1E16/cm^2$. The depth $D_1$ of the implantation is determined partially by the implantation energy used, and the preferred energy is between about 1 KeV and about 50 KeV, resulting in a preferred nominal depth of from about 5 nm to about 100 nm. When the diffusion-retarding regions 54 are formed, diffusion-retarding elements are preferably doped into the gate electrode 46 as well. If desired, however, the gate electrode 46 could be masked during the implanting step.

Figure 5:
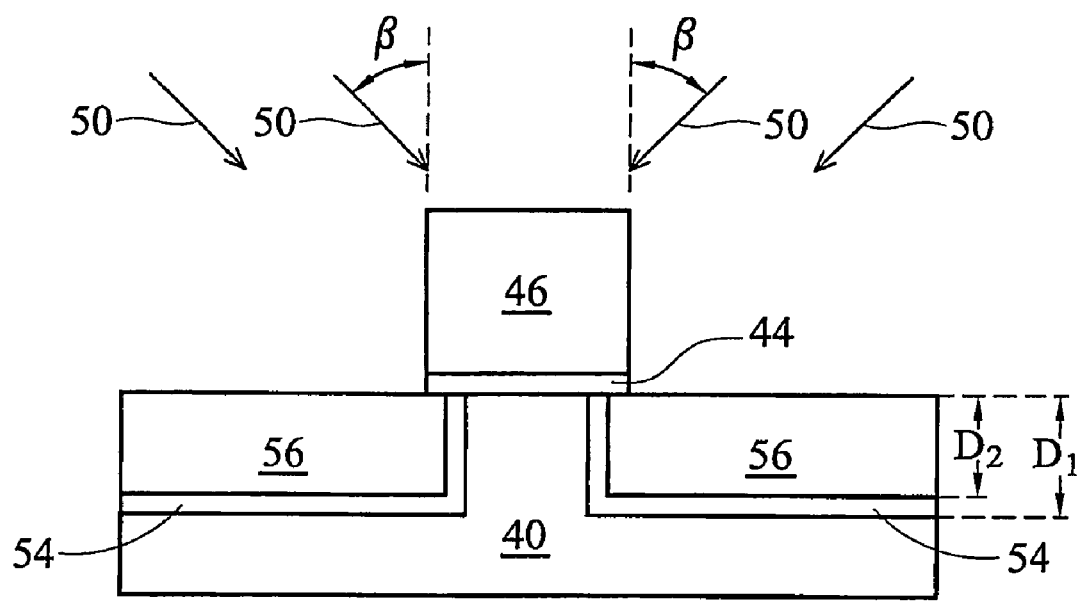
Figure 8:
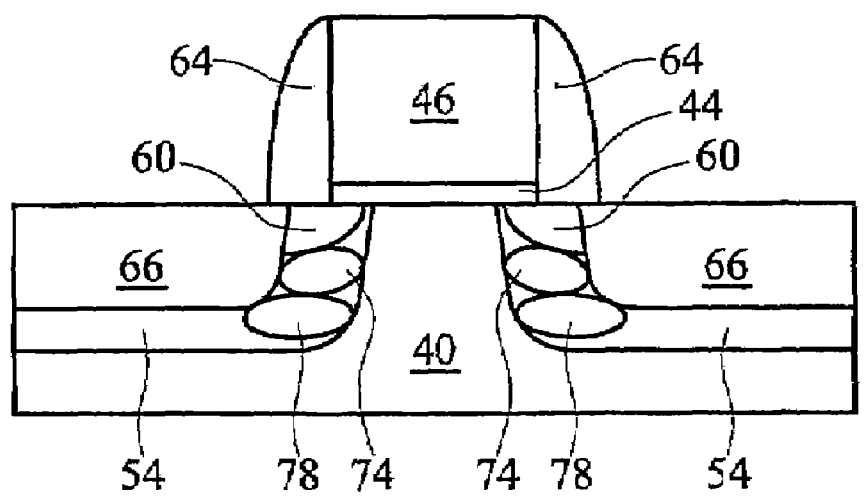

FIG. 5 illustrates the implantation of the p-type impurities, such as boron, $BF_2$, and indium. Tilt implants, as symbolized by arrows 50, are preferably conducted at an angle β of between about 0 degree and about 50 degrees, and p-type implant regions 56 are formed. It is to be noted that FIG. 5 is only a schematic illustration, and details of this implantation can be better explained combined with the structures of LDD and heavily doped source/drain regions. FIG. 8 will provide more details. Since the p-type implant regions 56 may be pockets/halos typically smaller in size than the diffusion-retarding regions 54, the p-type implant regions 56 are also referred to as pocket/halo regions 56. More than one implant is preferably conducted to form small pockets/halos, and details will be discussed in subsequent paragraphs referring to FIG. 8. The diffusion-retarding regions 54 preferably enclose the respective pocket/halo regions 56 so that the diffusion of p-type impurities is also retarded. Therefore, the depth $D_2$ of the pocket/halo regions 56 is preferably less than the depth $D_1$ of the diffusion-retarding regions 54. In the preferred embodiment, the p-type pocket/halo regions 56 are located around the side borders and junction of the subsequently formed LDD and heavily doped source/drain regions to neutralize lateral diffusion of the n-type impurities.

Figure 6:
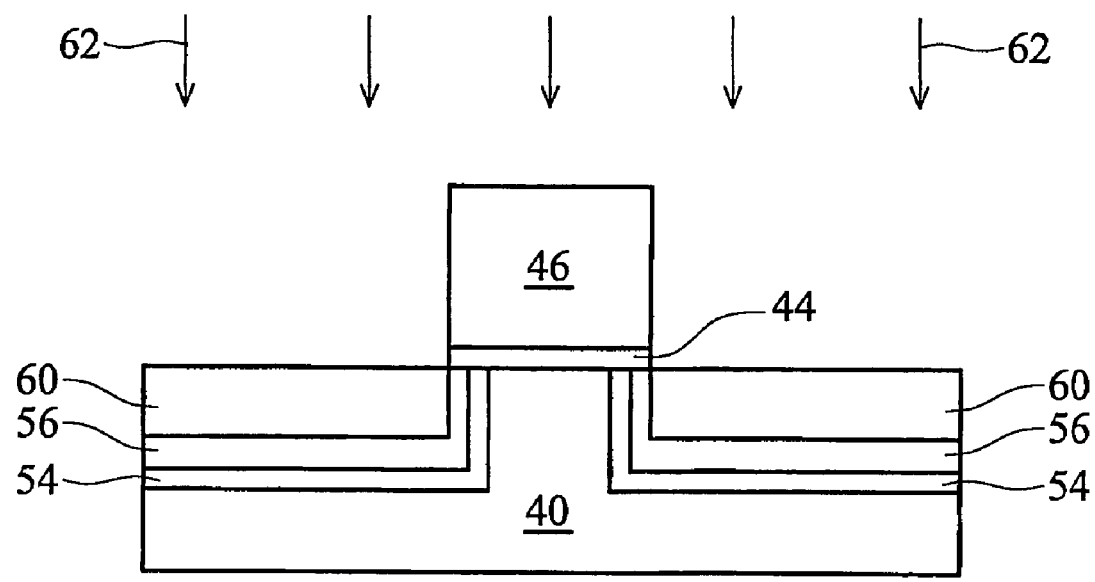

FIG. 6 illustrates the formation of lightly doped drain/source (LDD) regions 60. The LDD regions 60 are formed by implanting n-type impurities, such as arsenic and phosphorus. Arrows 62 symbolize the implanting, which is preferably substantially vertical. The LDD regions 60 therefore will preferably extend under the gate electrode less than the diffusion-retarding region 54, if at all. Therefore, the diffusion of the LDD regions 60 is retarded effectively, and a high concentration, preferably about $1E14/cm^3$ to about $1E16/cm^3$ can be achieved easily in desired regions. The LDD regions 60 and pocket/halo regions 56 can also be formed in reverse order. An optional LDD dopant activation may also be performed.

Figure 7:
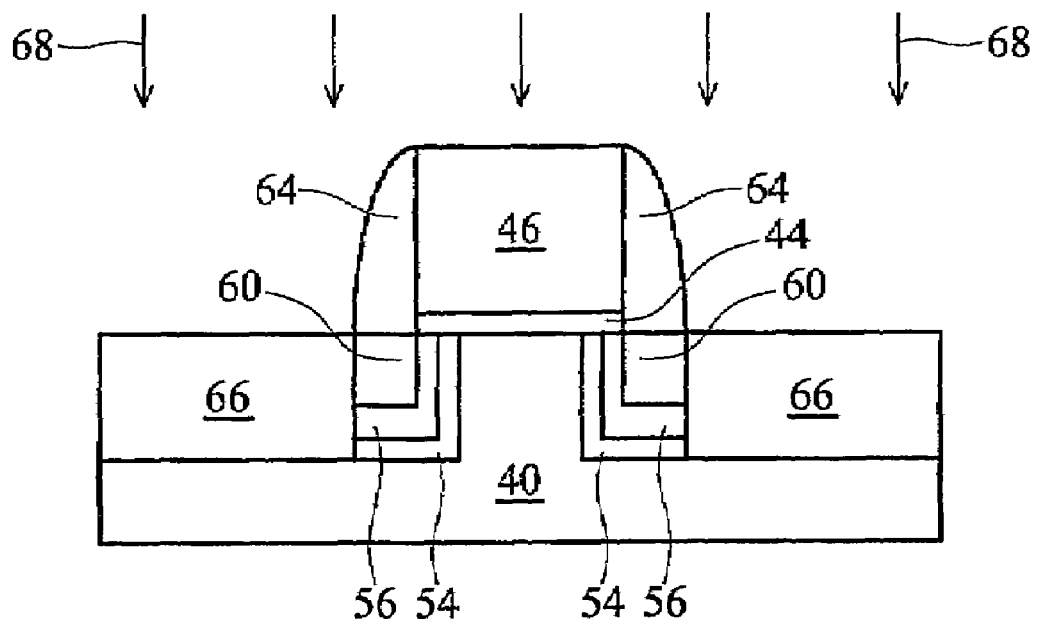

FIG. 7 illustrates the formation of spacers 64 and heavily doped source/drain (N+S/D) regions 66. A pair of spacers 64 is formed along the sidewalls of the gate dielectric 44 and gate electrode 46. As known in the art, spacers 64 are preferably formed by blanket depositing a dielectric layer over an entire region, then anisotropically etching to remove the dielectric layer from horizontal surfaces, and thus leaving spacers 64.

The spacers 64 are used as masks for the formation of the N+ S/D regions 66. As symbolized by arrows 68, n-type impurities, such as arsenic and phosphorus, are preferably implanted to a depth greater than the depth of the LDD regions 60. The concentration of the N+S/D regions 66 is preferably between about $1E15/cm^3$ and about $1E17/cm^3$.

The dopants introduced in previously discussed processes are then activated. The activation can be conducted using commonly used methods such as furnace annealing, rapid thermal annealing (RTA), laser annealing and flash, etc. During the activation, the p-type dopants and n-type dopants will diffuse both vertically and laterally. However, with diffusion-retarding regions 54 on the diffusion paths, the diffusions for both p-type and n-type dopants are reduced. Less diffusion for n-type impurities means higher concentration in the LDD regions 60 and N+ S/D regions 66, hence higher current drivability. Less diffusion of p-type impurities means higher concentration of p-type impurities at the border of the n-type diffusion region, hence higher neutralization ability. Particularly, less diffusion of impurities into the channel region improves the short channel characteristics.

The diffusion-retarding elements and n-type impurities, perhaps including p-type dopants, are also preferably implanted into the gate electrode 46. Diffusion of the impurities into the gate dielectric is thus reduced, and the reliability of the device is improved.

FIG. 8 illustrates an exemplary distribution of LDD regions 60, p-type pocket/halo regions 74, 78 and N+ source/drain regions 66 after activation. It shows that tilted implantation of the diffusion-retarding elements sends carbon/fluorine/nitrogen further into the region underlying the gate electrode 46, so that the diffusion retarding region 54 overlaps with the p-type and n-type regions. Both LDD regions 60 and N+ source/drain regions 66 diffuse less due to the effect of the diffusion-regarding elements. To improve the profile of the N+ regions 66, p-type impurities typically form pocket/halo structures, as shown by exemplary pocket/halo regions 74 and 78. The p-type impurities can be implanted more than once, forming pocket/halo regions at different locations and/or different depths. For each of the pocket/halo regions 74 and 78, a separate mask may be needed to control the location and size of the implanting. For example, regions 78 and 74 are formed along a desired contour of the N+ S/D regions 66. Regions 78 may be implanted with indium and regions 74 may be implanted with boron or $BF_2$. Since indium is heavier than boron, it is easier to implant deeper than boron. With multiple implants, it is easier to have a higher concentration of impurities in each of the several regions so that a customized profile can be formed. Note that regions 74 and 78 have a high concentration of p-type impurities due to the presence of diffusion-retarding region 54. When the n-type impurities in the heavily doped source/drain regions 66 diffuse to regions 74 and 78, the n-type impurities are neutralized, thus forming N+ S/D regions 66 with greater abruptness in profile.

To have an optimized effect, the diffusion-retarding region 54 preferably encloses the pocket/halo regions 74, 78, the LDD regions 60, and the N+ S/D regions 66 from both the bottom side and the side close to the channel region (referred to as the channel side). The pocket/halo regions 74, 78 are preferably located on the border of the N+ S/D regions 66 on the channel side, and also preferably along the bottom border of the N+ S/D regions to suppress vertical diffusion. More pocket/halo regions can be formed along the bottom of the N+ S/D regions.

Figure 9:
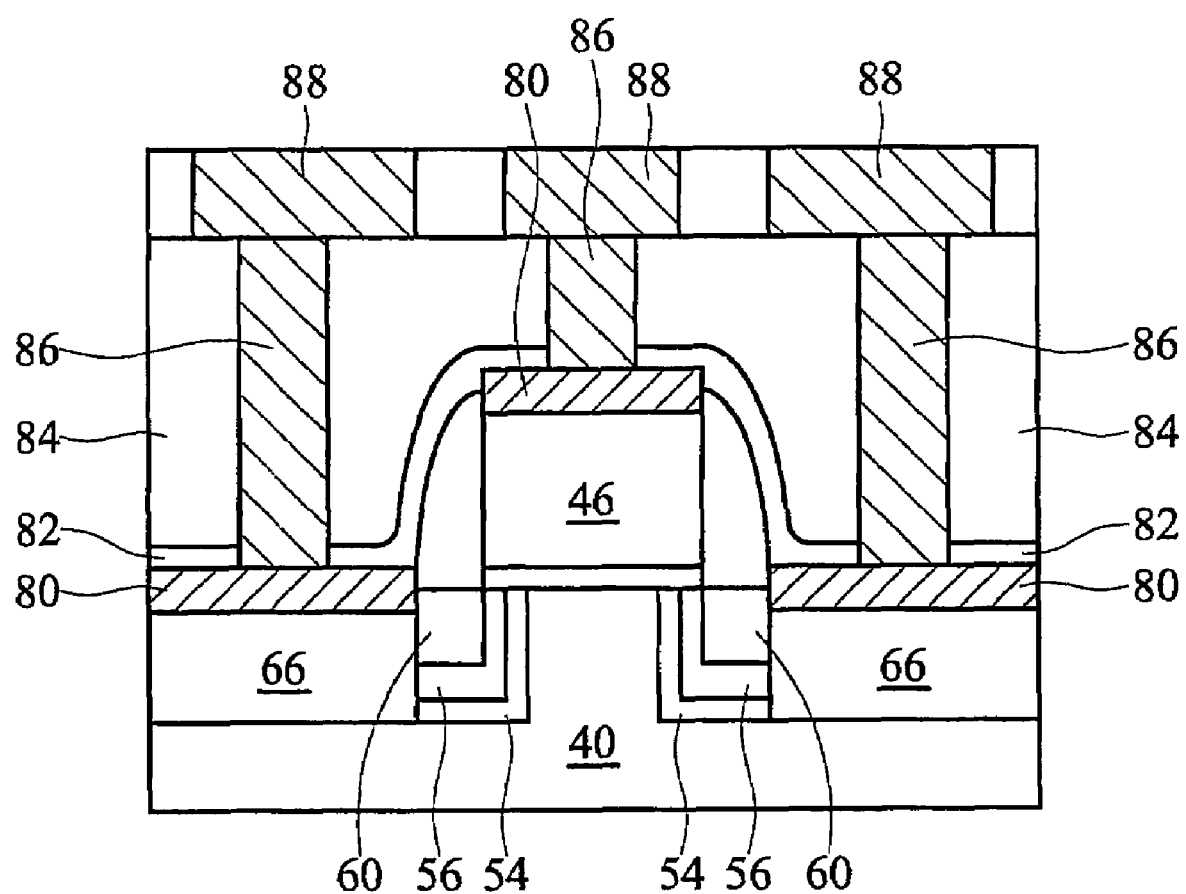

FIG. 9 illustrates a structure after the formation of silicides 80, a contact etch stop layer (CESL) 82, an inter-layer dielectric (ILD) 84, contact plugs 86 and metal lines 88. To form the silicides 80, a thin layer of metal (not shown), such as cobalt, nickel, erbium, molybdenum, platinum, or the like, is first formed over the device. The device is then annealed to form silicides 80 between the deposited metal and the underlying exposed silicon regions. The remaining metal layer is then removed. The CESL 82 is preferably blanket deposited. This layer serves two purposes. First, it provides a stress to the device and enhances carrier mobility. Second, it protects underlying regions from being over etched. Next, the ILD 84 is deposited over the surface of CESL 82. The contact plugs 86 and metal lines 88 are then formed. The processes of forming such are well known in the art and therefore are not repeated herein.

Although the preferred embodiments provide a method of forming NMOS devices, one skilled in the art will realize that the teaching provided is readily available for the formation of pMOS devices, with the types of the respective pocket/halo region, LDD region and N+ S/D regions inverted.

Figure 10:
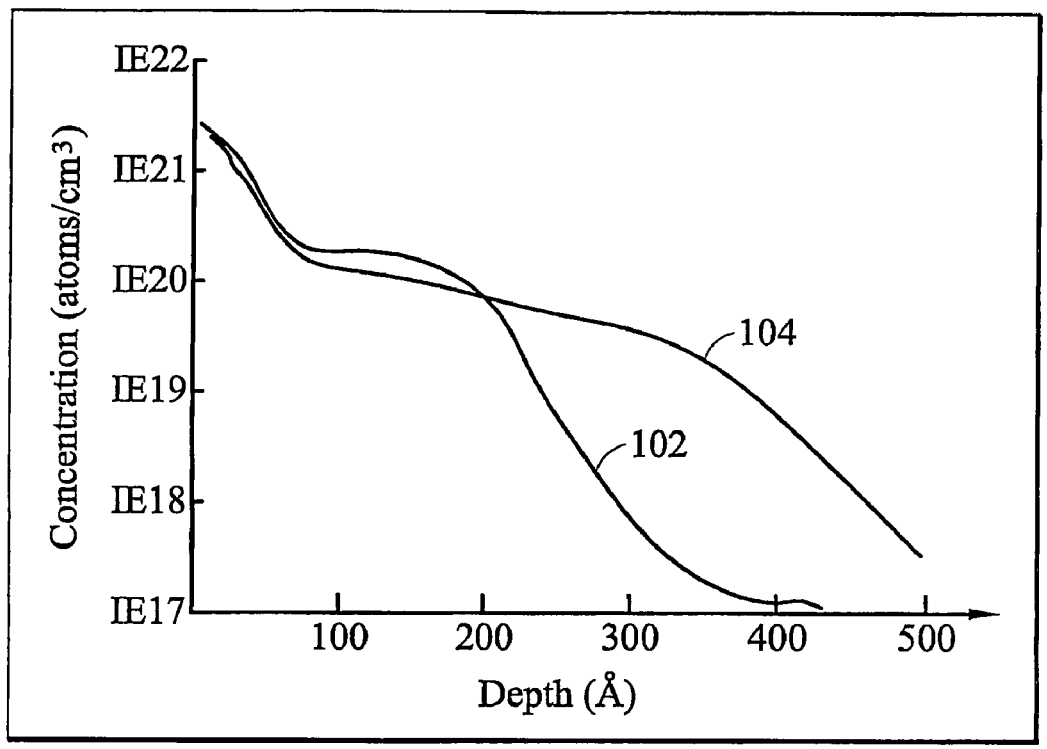
FIG. 10 illustrates concentrations of boron as the function of depth.
Figure 11:
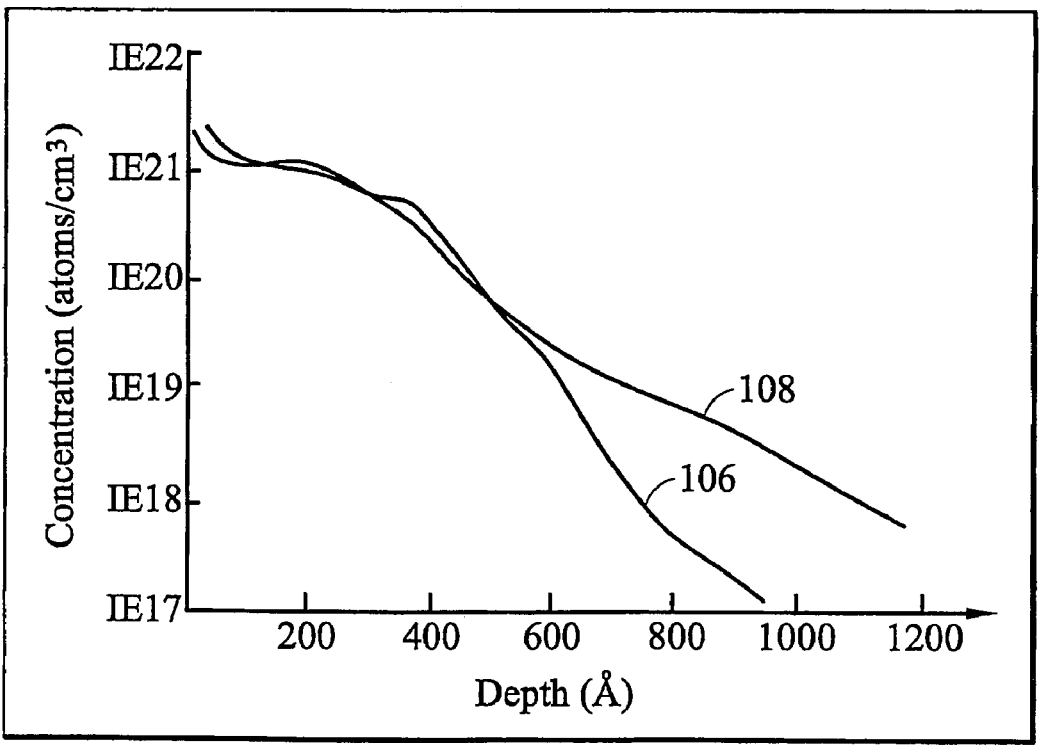
FIG. 11 illustrates concentrations of phosphorus as the function of depth.

The effect of the preferred embodiments of the present invention is shown in FIGS. 10 and 11. FIG. 10 illustrates boron concentrations as the function of depth. Line 102 is obtained from a first sample device that had a pre-amorphized implantation and co-implanted with boron and carbon. Line 104 is obtained from a second sample device that had only boron implanted. Line 102 has a greater abruptness than line 104. From the Line 104, it is found that the junction depth of the second sample device is about 404 Å. Due to retarded diffusion, the junction depth of the first sample device is about 256 Å, less than that of the second sample device. The sheet resistance of the first sample device relative to its junction depth is also lower than that of the second sample device. Therefore, FIG. 10 clearly shows the retarding effect of the diffusion-retarding impurities to the distribution of boron.

The distribution of phosphorus shows similar results. FIG. 11 illustrates the phosphorus concentrations as the function of depth. Line 106 is obtained from a third sample device that had a pre-amorphized implantation and co-implanted with phosphorus and carbon. Line 108 is obtained on a fourth sample device that had only phosphorus implanted. Line 106 has a greater abruptness than the line 108. The junction depth of the fourth sample device is about 1125 Å, while due to retarded diffusion, the junction depth of the third sample device is about 708 Å, less than that of the fourth sample device. The sheet resistance of the third sample device relative to its junction depth is also lower than that of the fourth sample device.

From FIGS. 10 and 11, it is found that the addition of carbon/fluorine/nitrogen combined with the p-type impurity implantation significantly improves the NMOS device profile, lowers sheet resistance and reduces junction depth. The preferred embodiments of the present invention have several advantageous features. Firstly, less diffusion results in higher activation level (or concentration) in desired regions, and thus sheet resistance is lowered. The polysilicon gate depletion effect is also reduced. Secondly, greater abruptness means less boron and phosphorus are diffused to the gate dielectric, resulting in better gate oxide integrity and threshold voltage control. Thirdly, retarded diffusion enables higher concentration in the gate electrode, LDD region, and N+ S/D regions, and thus the saturation current is increased.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a semiconductor substrate with a channel region;
a gate dielectric over the channel region;
a gate electrode over the gate dielectric;
a lightly doped source/drain (LDD) region substantially aligned with an edge of the gate electrode, the LDD region comprising an n-type impurity;
a heavily doped source/drain (N+ S/D) region in the semiconductor substrate, the N+ S/D region comprising an n-type impurity and being further away from the channel region than the LDD region;
a p-type pocket/halo region substantially along a border of the N+ S/D region, the border being on a side close to the channel region; and
a diffusion-retarding region in the semiconductor substrate substantially aligned with an edge of the gate electrode, wherein the diffusion-retarding region comprises fluorine, and wherein the diffusion-retarding region is substantially deeper than the N+ S/D region, and wherein the diffusion-retarding region extends into a region underlying the gate electrode.

2. The semiconductor device of claim 1 wherein the diffusion-retarding region further comprises a material selected from the group consisting essentially of carbon, nitrogen, and combinations thereof.

3. The semiconductor device of claim 1 wherein the diffusion-retarding region is substantially deeper than the p-type pocket/halo region.

4. The semiconductor device of claim 1 wherein the diffusion-retarding region has a side border substantially closer to the channel region than the p-type pocket/halo region.

5. The semiconductor device of claim 1 wherein the diffusion-retarding region is substantially deeper than the LDD region.

6. The semiconductor device of claim 1 wherein the diffusion-retarding region has a side border substantially closer to the channel region than the LDD region.

7. The semiconductor device of claim 1 wherein the p-type pocket/halo comprises a material selected from the group consisting essentially of boron, BF2, indium, and combinations thereof.

8. The semiconductor device of claim 1 wherein the LDD region and the N+ S/D region comprise a material selected from the group consisting essentially of arsenic, phosphorus, and combinations thereof.

9. The semiconductor device of claim 1 wherein the pocket/halo region is located substantially along a bottom border of the N+ S/D region.

10. The semiconductor device of claim 1 wherein the gate electrode comprises a diffusion-retarding material and an n-type impurity.

11. A device comprising:
a substrate;
a diffusion-retarding region in the substrate, wherein the diffusion-retarding region comprises fluorine;
a source/drain region of a first conductivity type in the substrate and substantially contained within the diffusion-retarding region; and
a pocket/halo region of an opposite conductivity type formed substantially adjacent an interface of the source/drain region and the substrate, the pocket/halo region being substantially contained within the diffusion-retarding region.

12. The device of claim 11 wherein the first conductivity type is n-type.

13. The device of claim 11 wherein the source/drain region further comprises a LDD region and a heavily doped region.

14. The device of claim 11 wherein the diffusion-retarding region further comprises a material selected from the group consisting essentially of carbon, nitrogen, and combinations thereof.

15. A semiconductor device comprising:
a semiconductor substrate with a channel region;
a gate dielectric over the channel region;
a gate electrode over the gate dielectric;
a lightly doped source/drain (LDD) region substantially aligned with an edge of the gate electrode, the LDD region comprising an n-type impurity;
a heavily doped source/drain (N+ S/D) region in the semiconductor substrate, the N+ S/D region comprising an n-type impurity and being further away from the channel region than the LDD region;
a p-type pocket/halo region substantially along a border of the N+ S/D region, the border being on a side close to the channel region; and
a diffusion-retarding region in the semiconductor substrate substantially aligned with an edge of the gate electrode, wherein the diffusion-retarding region comprises fluorine, and wherein the pocket/halo region is located substantially along a bottom border of the N+ S/D region.

* * * * *

UNITED STATES PATENT AND TRADEMARK OFFICE
CERTIFICATE OF CORRECTION

PATENT NO.         : 7,498,642 B2
APPLICATION NO.    : 11/114567
DATED              : March 3, 2009
INVENTOR(S)        : Chen et al.

It is certified that error appears in the above-identified patent and that said Letters Patent is hereby corrected as shown below:

In Col. 2, line 10, delete "NMOS" and insert --nMOS--.
In Col. 6, line 2, delete "NMOS" and insert --nMOS--.
In Col. 8, lines 27-45, delete claim 15 in its entirety.
In the claims section, insert the following mistakenly omitted claim; --9. The semiconductor device of claim 1 wherein the diffusion-retarding region has a side border substantially closer to the channel region than the N+S/D region.--.

Signed and Sealed this

Fifth Day of January, 2010

David J. Kappos
*Director of the United States Patent and Trademark Office*

UNITED STATES PATENT AND TRADEMARK OFFICE
CERTIFICATE OF CORRECTION

PATENT NO. : 7,498,642 B2
APPLICATION NO. : 11/114567
DATED : March 3, 2009
INVENTOR(S) : Chen et al.

It is certified that error appears in the above-identified patent and that said Letters Patent is hereby corrected as shown below:

In Col. 2, line 10, delete "NMOS" and insert --nMOS--.
In Col. 6, line 2, delete "NMOS" and insert --nMOS--.
Col. 7, line 39 - Col. 8, line 45,
Delete Claims 7-15 and substitute therefore the attached Claims 7-15.

7. The semiconductor device of claim 1 wherein the diffusion-retarding region has a side border substantially closer to the channel region than the N+ S/D region.

8. The semiconductor device of claim 1 wherein the p-type pocket/halo comprises a material selected from the group consisting essentially of boron, BF2, indium, and combinations thereof.

9. The semiconductor device of claim 1 wherein the LDD region and the N+ S/D region comprise a material selected from the group consisting essentially of arsenic, phosphorus, and combinations thereof.

10. The semiconductor device of claim 1 wherein the pocket/halo region is located substantially along a bottom border of the N+ S/D region.

11. The semiconductor device of claim 1 wherein the gate electrode comprises a diffusion-retarding material and an n-type impurity.

12. A device comprising:
a substrate;
a diffusion-retarding region in the substrate, wherein the diffusion-retarding region comprises fluorine;
a source/drain region of a first conductivity type in the substrate and substantially contained within the diffusion-retarding region; and
a pocket/halo region of an opposite conductivity type formed substantially adjacent an interface of the source/drain region and the substrate, the pocket/halo region being substantially contained within the diffusion-retarding region.

CERTIFICATE OF CORRECTION (continued)
U.S. Pat. No. 7,498,642 B2

13.    The device of claim 11 wherein the first conductivity type is n-type.

14.    The device of claim 11 wherein the source/drain region further comprises a LDD region and a heavily doped region.

15.    The device of claim 11 wherein the diffusion-retarding region further comprises a material selected from the group consisting essentially of carbon, nitrogen, and combinations thereof.

This certificate supersedes the Certificate of Correction issued January 5, 2010.

Signed and Sealed this

Twenty-sixth Day of January, 2010

David J. Kappos
*Director of the United States Patent and Trademark Office*

UNITED STATES PATENT AND TRADEMARK OFFICE
CERTIFICATE OF CORRECTION

PATENT NO.        : 7,498,642 B2
APPLICATION NO.   : 11/114567
DATED             : March 3, 2009
INVENTOR(S)       : Chen et al.

It is certified that error appears in the above-identified patent and that said Letters Patent is hereby corrected as shown below:

In Col. 2, line 10, delete "NMOS" and insert --nMOS--.
In Col. 6, line 2, delete "NMOS" and insert --nMOS--.
Col. 7, line 39 - Col. 8, line 45,
Delete Claims 7-15 and substitute therefore the attached Claims 7-15.

7. The semiconductor device of claim 1 wherein the diffusion-retarding region has a side border substantially closer to the channel region than the N+ S/D region.

8. The semiconductor device of claim 1 wherein the p-type pocket/halo comprises a material selected from the group consisting essentially of boron, BF2, indium, and combinations thereof.

9. The semiconductor device of claim 1 wherein the LDD region and the N+ S/D region comprise a material selected from the group consisting essentially of arsenic, phosphorus, and combinations thereof.

10. The semiconductor device of claim 1 wherein the pocket/halo region is located substantially along a bottom border of the N+ S/D region.

11. The semiconductor device of claim 1 wherein the gate electrode comprises a diffusion-retarding material and an n-type impurity.

12. A device comprising:
a substrate;
a diffusion-retarding region in the substrate, wherein the diffusion-retarding region comprises fluorine;
a source/drain region of a first conductivity type in the substrate and substantially contained within the diffusion-retarding region; and
a pocket/halo region of an opposite conductivity type formed substantially adjacent an interface of the source/drain region and the substrate, the pocket/halo region being substantially contained within the diffusion-retarding region.

13. The device of claim 12 wherein the first conductivity type is n-type.

14. The device of claim 12 wherein the source/drain region further comprises a LDD region and a heavily doped region.

15. The device of claim 12 wherein the diffusion-retarding region further comprises a material selected from the group consisting essentially of carbon, nitrogen, and combinations thereof.

This certificate supersedes the Certificates of Correction issued January 5, 2010 and January 26, 2010.

Signed and Sealed this

Thirteenth Day of April, 2010

David J. Kappos
*Director of the United States Patent and Trademark Office*